United States Patent [19]
Nishimura et al.

[11] Patent Number: 5,852,328
[45] Date of Patent: Dec. 22, 1998

[54] SEMICONDUCTOR DEVICE AND METHOD OF MANUFACTURING THE SAME

[75] Inventors: Hiroshi Nishimura, Toyama; Shinichi Ogawa, Osaka, both of Japan

[73] Assignee: Matsushita Electronics Corporation, Osaka, Japan

[21] Appl. No.: 795,427

[22] Filed: Feb. 5, 1997

[30] Foreign Application Priority Data

Feb. 5, 1996 [JP] Japan .................................... 8-018887

[51] Int. Cl.$^6$ .......................... H01L 23/48; H01L 23/52; H01L 29/40
[52] U.S. Cl. .......................... 257/774; 257/763; 257/740
[58] Field of Search .................... 257/774, 763, 257/740

[56] References Cited

U.S. PATENT DOCUMENTS

| | | | |
|---|---|---|---|
| 3,725,743 | 4/1973 | Murayama | 257/750 |
| 4,713,682 | 12/1987 | Erie et al. | 257/774 |
| 4,767,724 | 8/1988 | Kim et al. | 437/194 |
| 4,860,084 | 8/1989 | Shibata | 257/740 |

FOREIGN PATENT DOCUMENTS

| | | | |
|---|---|---|---|
| 62-139352 | 6/1987 | Japan | 257/763 |
| 4122362 | 1/1993 | Japan | 257/770 |

OTHER PUBLICATIONS

Hiroshi Nishimura, Tatsuya Yamada and Shin-ichi Ogawa, "Reliable Submicron Vias Using Aluminum Alloy High Temperature Sputter Filling," Proceedings, Eighth International IEEE VLSI Multilevel Interconnection Conference, (pp. 170–176), 1991.

Primary Examiner—Mahshid D. Saadat
Assistant Examiner—Jhihan B. Clark
Attorney, Agent, or Firm—Stevens, Davis, Miller & Mosher, L.L.P.

[57] ABSTRACT

After forming a first wire on a first interlayer insulation film, a second interlayer insulation film is formed and planarized, to thereby form a via hole. At this stage, the via hole is formed off the first wire. Next, after making an exposed edge and an exposed side wall of the first wire slanted surfaces, a second wire is formed with or without a conductive film buried within the via hole. Since the side wall of the first wire is a slanted surface in this manner, it is possible to completely bury a wire material of the second wire or the conductive film within the via hole, and therefore, it is possible to ensure electric conduction all over the slanted surfaces of the first wire. As a result, even if the via hole which connects the first wire in a lower layer and the second wire in an upper layer is formed of f the first wire, an increase in a wire resistance in the via hole is prevented.

5 Claims, 7 Drawing Sheets

SEMICONDUCTOR DEVICE AND METHOD OF MANUFACTURING THE SAME

BACKGROUND OF THE INVENTION

1. Field of the Invention

The present invention relates to a semiconductor device having a borderless multi-layered wire structure and a method of manufacturing the same, and more particularly, to a semiconductor device which includes a via hole and a method of manufacturing the same.

2. Description of the Background Art

As semiconductor integrated circuits become denser, development of a highly reliable multi-layered wire technique is demanded. One of the reliability failures of multi-layered wires is a so-called electromigration failure in which the resistance of a wire is increased or a disconnection failure is caused as metal atoms which form the wire are pushed away by electrons which flow in the wire. At a via hole, in particular, since a step coverage of the wire (i.e., a coverage of covering a step) degrades as the via hole becomes finer, a current density tends to increase and hence an electromigration resistance tends to weaken.

Now, a description will be given on a semiconductor device having a borderless multi-layered wire structure including a conventional via hole and a method of manufacturing the same.

FIG. 6 is a process sectional view showing a method of manufacturing a conventional semiconductor device.

First, as shown in FIG. 6(a), after forming a first interlayer insulation film 15 on a silicon substrate 14, a first Al-Si-Cu wire 16 is formed. In this case, as a material for the first wire, other alloy materials such as Al-Cu, Al-Cu-Ti, Al-Ge-Cu, Al-Sc, Al-Pd-Cu, Al-Mg may be used. Alternatively, a wire structure in which conductive films such as TiN, Ti and W are stacked one atop the other may be used.

Next, as shown in FIG. 6(b), after forming a second interlayer insulation film 17 on the entire surface, by an etch-back method or a chemical mechanical polishing method, the second interlayer insulation film 17 is planarized, to thereby open a via hole 18. In this case, the via hole 18 is formed by a photolithographic method and a dry etching method.

Next, as shown in FIG. 6(c), after removing a natural oxide film of a wire in a bottom surface of the via hole 18 by Ar sputter etching, by a sputtering method, an Ti film 19 is formed on the entire surface.

Next, as shown in FIG. 6(d), a second Al-Si-Cu wire 20 is formed by a high-temperature sputtering method. The second Al-Si-Cu wire 20 is deposited at a temperature between 400° C. and 500° C. and buried in the via hole 18. In this case, as a material for the second wire, other alloy materials such as Al-Cu, Al-Ge-Cu, Al-Sc, Al-Pd-Cu may be used (e.g., IEEE VLSI Multilevel Interconnection Conference (1991) pp. 170–176).

In this manner, since the second Al-Si-Cu wire 20 is completely buried in the via hole 18, an increased resistance of the wire and a disconnection failure within the via hole 18 are prevented, whereby the reliability of the multi-layered wire structure is improved.

However, in such a structure as described above, when the via hole 18 is formed shifted in a direction off the first Al-Si-Cu wire 16 due to a failure to align a mask at a photolithographic step, it is impossible to completely bury the second Al-Si-Cu wire 20 in the via hole 18, and therefore, a wire resistance within the via hole 18 is increased. This will be described with reference to FIG. 7.

FIGS. 7(a)–(c) are process sectional view for describing the problems above.

As shown in FIG. 7(a), after forming the first interlayer insulation film 21 on the silicon substrate (not shown), the first Al-Si-Cu wire 22 is formed and a second interlayer insulation film 23 is formed. Following this, during formation of a via hole 24, if the via hole 24 is displaced against the first Al-Si-Cu wire 22, as shown in FIG. 7(a), the second interlayer insulation film 23 in the vicinity of a side wall surface of the first Al-Si-Cu wire 22 is etched, and therefore, the side wall surface is exposed and the via hole 24 is formed thereat. Next, when a second Al-Si-Cu wire 26 is buried in the via hole 24 by a high-temperature sputtering method as shown in FIG. 7(c) after surface treatment is performed and a Ti film 25 is deposited as shown in FIG. 7(b), since it is difficult fill up a fine and deep portion of the via hole 24 in the vicinity of the side wall surface of the first Al-Si-Cu wire 22, a void 27 is created. This decreases a surface area of an edge of the first Al-Si-Cu wire 22 which contacts the second Al-Si-Cu wire 26 within the via hole 24. Further, in the side wall surface of the first Al-Si-Cu wire 22, electric conduction between the first Al-Si-Cu wire 22 and the second Al-Si-Cu wire 26 is not obtained, and hence, a wire resistance in the via hole 24 is increased.

SUMMARY OF THE INVENTION

Accordingly, an object of the present invention is to provide for a semiconductor device and a method of manufacturing the same, in which an increase in a wire resistance in a via hole which connects a first wire in a lower layer and a second wire in an upper layer is prevented even if the via hole is formed displaced against the first wire.

A semiconductor device according to the present invention comprises a first wire which is formed on a semiconductor substrate and whose side wall is a slanted surface, an interlayer insulation film which is formed on the first wire, a via hole which is opened in the interlayer insulation film with the slanted surface of the first wire exposed, and a second wire which is formed in the via hole and on the interlayer insulation film.

In this case, a conductive film of a different material from a wire material may be buried in the via hole.

A method of manufacturing a semiconductor device according to the present invention comprises the steps of: forming a first wire on a semiconductor substrate; forming an interlayer insulation film which covers the first wire; forming a via hole in the interlayer insulation film so that an edge of the first wire is exposed; sputtering the edge and a side wall of the first wire which are exposed within the via hole so that the edge and the side wall become slanted surfaces; and forming a second wire in the via hole and on the interlayer insulation film.

In this case, a conductive film of a different material from a wire material may be buried in the via hole.

According to the present invention, even if the side wall of the first wire is exposed as the via hole is formed displaced against the first wire, since the edge and the side wall of the first wire which are exposed within the via hole are slanted surfaces, it is possible to completely bury a wire material or a conductive film in the via hole, which in turn prevents creation of a void within the via hole and ensures electrical conduction all over the slanted surfaces of the first wire. Hence, it is possible to reduce a wire resistance in the via hole.

DESCRIPTION OF THE PREFERRED EMBODIMENTS

Figure 1:
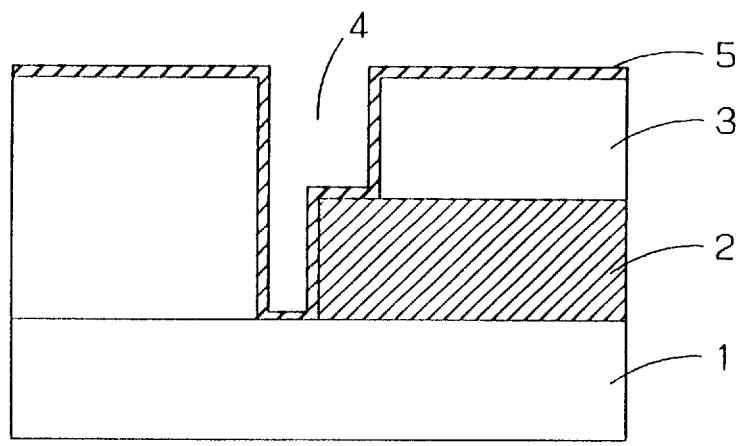
FIGS. 1(a)–1(c) are process sectional view showing a method of manufacturing a semiconductor device according to a first preferred embodiment of the present invention.
Figure 1:
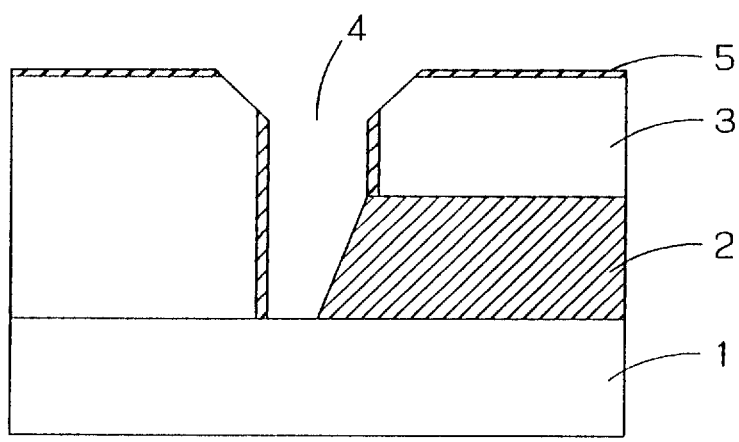
Figure 1:
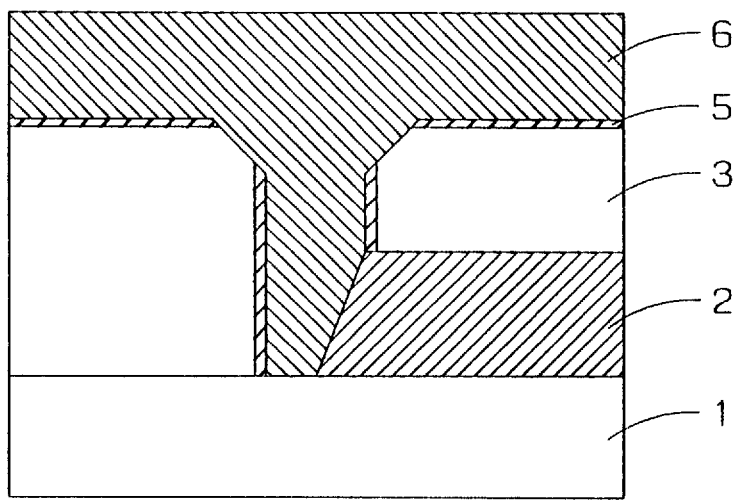

Preferred embodiments of the present invention will be described with reference to the drawings.

FIGS. 1(a)–(c) are process sectional views showing a method of manufacturing a semiconductor device according to a first preferred embodiment of the present invention.

First, as shown in FIG. 1(a), after forming a first interlayer insulation film 1 on a silicon substrate (not shown) seating a semiconductor element, a first Al-Si-Cu wire 2 is formed. Next, after forming a second interlayer insulation film 3 on the entire surface and sputtering, a via hole 4 is formed by a photolithographic method and a dry etching method. At this stage, a mask is misaligned at a photolithographic step, so that an edge and a side wall of the first Al-Si-Cu wire 2 are exposed, a small via hole is formed in the vicinity of a side wall surface as well, and the depth of the via hole 4 is increased. Next, after performing surface treatment by Ar sputter etching, a Ti film 5 is formed on the entire surface by a sputtering method.

Following this, as shown in FIG. 1(b), Ar sputter etching is performed, whereby the top surface edge and the side wall of the first Al-Si-Cu wire 2 which are exposed within the via hole 4 become slanted surfaces. With respect to sputter etching, it is widely known that an etch rate is dependent upon an incident direction of ions and an angle between the ions and an etched object surface. When the incident direction of the ions and the angle between the ions and the etched object surface are between 40 and 60 degrees, the etch rate becomes maximum. That is, since an edge portion at which the side wall surface and the top surface edge of the first Al-Si-Cu wire 2 intersect each other is etched first if the incident direction of the ions is controlled so as to be perpendicular to the silicon substrate, it is possible to form the side wall surface of the first Al-Si-Cu wire 2 slanted. In this case, the second interlayer insulation film 3 above the via hole 4 is also formed slated.

Next, as shown in FIG. 1(c), a second Al-Si-Cu wire 6 is formed by a high-temperature sputtering method. The second Al-Si-Cu wire 6 is buried into the via hole 4 at a deposition temperature between 400° C. and 500° C. In this case, since the side wall of the first Al-Si-Cu wire 2 is a slated surface, it is easy to bury the second Al-Si-Cu wire 6.

Figure 2:
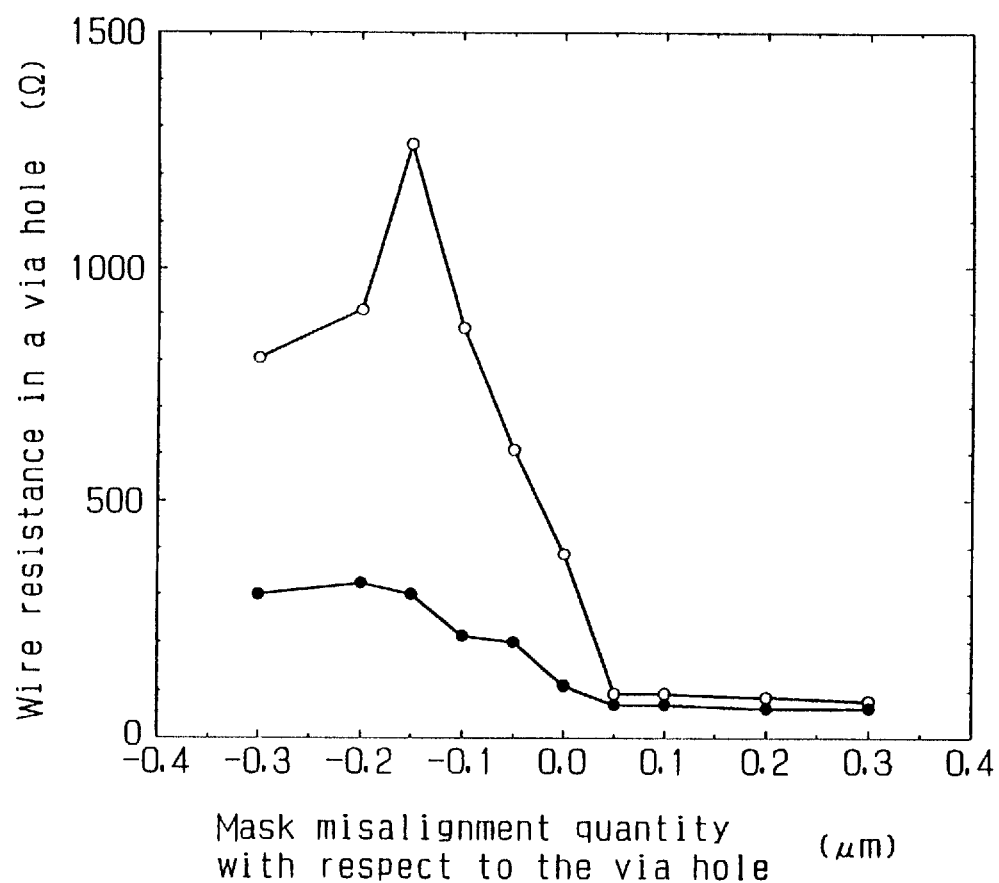
FIG. 2 is a view showing a relationship between a wire resistance in a via hole and a mask misalignment quantity with respect to the via hole in the first preferred embodiment.
Figure 3:
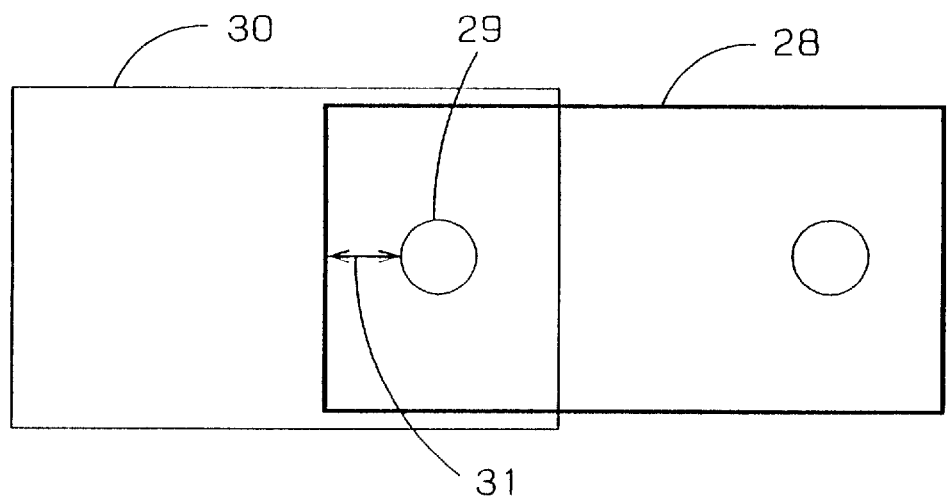
FIG. 3 is a plan view of an evaluation pattern of a wire resistance within the via hole.

FIG. 2 shows a relationship between a wire resistance in a via hole (i.e., via chain resistance : vertical axis) and a mask misalignment quantity with respect to the via hole (i.e., overlap margin : horizontal axis) in the first preferred embodiment. FIG. 2 also shows a relationship with the conventional technique for the purpose of comparison. White circles denote the conventional technique, while black circles denote the first preferred embodiment. The case using the conventional technique mentioned here is a case where Ar sputter etching is not performed which is done to make the top surface edge and the side wall of the first Al-Si-Cu wire 2 slanted surfaces in FIG. 1. The conventional technique mentioned is otherwise similar to the first preferred embodiment. Further, the mask misalignment quantity with respect to the via hole (i.e., overlap margin) expresses a distance between the side wall at the edge of a first wire 28 and a via hole 29.

While the invention has been described in detail, the foregoing description is in all aspects illustrative and not restrictive. It is understood that numerous other modifications and variations can be devised without departing from the scope of the invention. When the figure is a negative figure, that means that the via hole 29 runs off the first wire 28.

As shown in FIG. 2, in the conventional technique, a wire resistance abruptly increases when an overlap margin becomes 0 μm or shorter. For example, when an overlap margin is –0.15 μm, a wire resistance is 1200 Ω or higher. On the other hand, in the first preferred embodiment, when an overlap margin is –0.15 μm, the wire resistance is suppressed to about 300 Ω. In this case, the via hole is around hole having a diameter of 0.6 μm.

As described above, in the first preferred embodiment, even if the via hole 4 is formed deep and off the first Al-Si-Cu wire 2 as a result of alignment of a mask at a lithographic step, since the edge and the side wall of the first Al-Si-Cu wire 2 which are exposed within the via hole 4 are slanted surfaces as shown in FIG. 1, it is possible to completely bury the second Al-Si-Cu wire 6 in the via hole 4. This prevents creation of a void within the via hole 4 and ensures electrical conduction all over the slanted surfaces of the first Al-Si-Cu wire 2. Hence, it is possible to reduce the wire resistance in the via hole 4.

Figure 4:
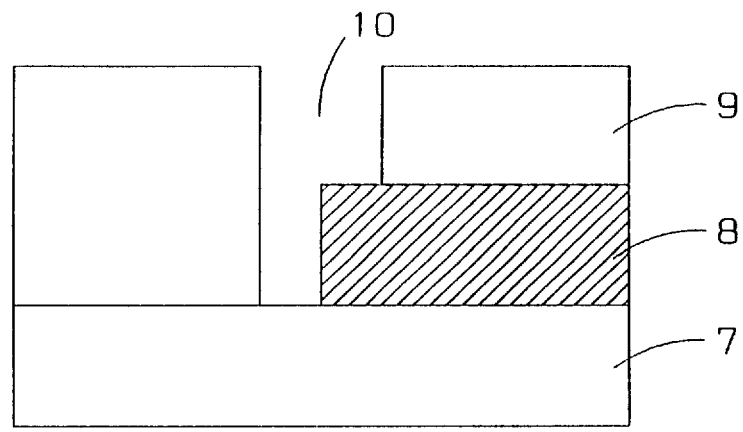
FIGS. 4(a)–4(c) are process sectional view showing a method of manufacturing a semiconductor device according to a second preferred embodiment of the present invention.
Figure 4:
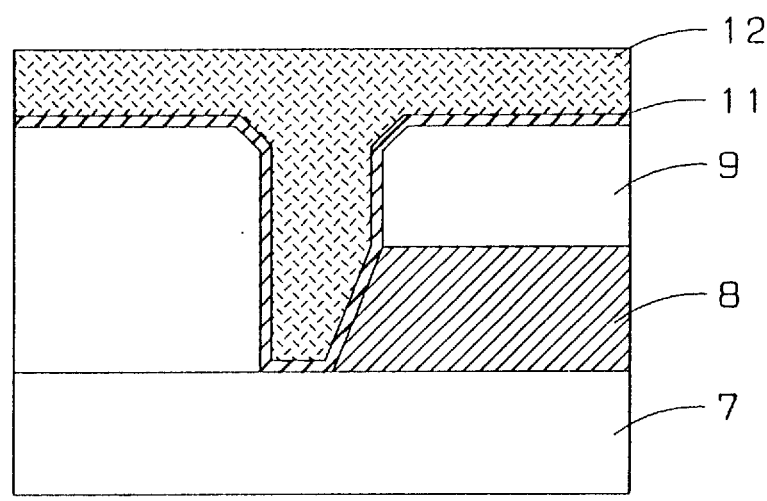
Figure 4:
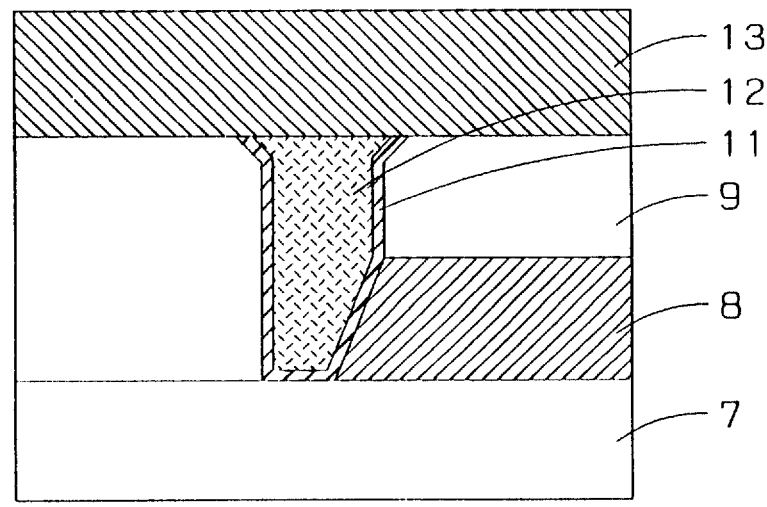

FIG. 4 is a process sectional view showing a method of manufacturing a semiconductor device according to a second preferred embodiment of the present invention.

First, as shown in FIG. 4(a), after forming a first Al-Si-Cu wire 8 on a first interlayer insulation film 7 on a silicon substrate (not shown), a second interlayer insulation film 9 is formed on the entire surface. Next, a via hole 10 is formed by a photolithographic method and a dry etching method. At this stage, a mask is misaligned at a photolithographic step, so that an edge and a side wall of the first Al-Si-Cu wire 8 are exposed, a small via hole is formed in the vicinity of a side wall surface as well, and the depth of the via hole 10 is increased.

Next, as shown in FIG. 4(b), after performing Ar sputter etching so that the edge and the side wall of the first Al-Si-Cu wire 8 which are exposed within the via hole 10 become slanted surfaces, a tightly adhered layer 11 consisting of two layer films of a Ti film and a TiN film is formed. During Ar sputter etching, a condition with a higher anisotropism than a condition which is generally used for surface treatment is used, for easy formation of a slanted portion in the second interlayer insulation film 9 above the via hole 10. Next, a tungsten film 12 is formed by a blanket CVD method and buried in the via hole 10.

Following this, as shown in FIG. 4(c), after removing the tungsten film 12 and the tightly adhered layer 11 by an etch back method except in the via hole 10, surface treatment is performed to thereby form a second Al-Si-Cu wire 13.

Figure 5:
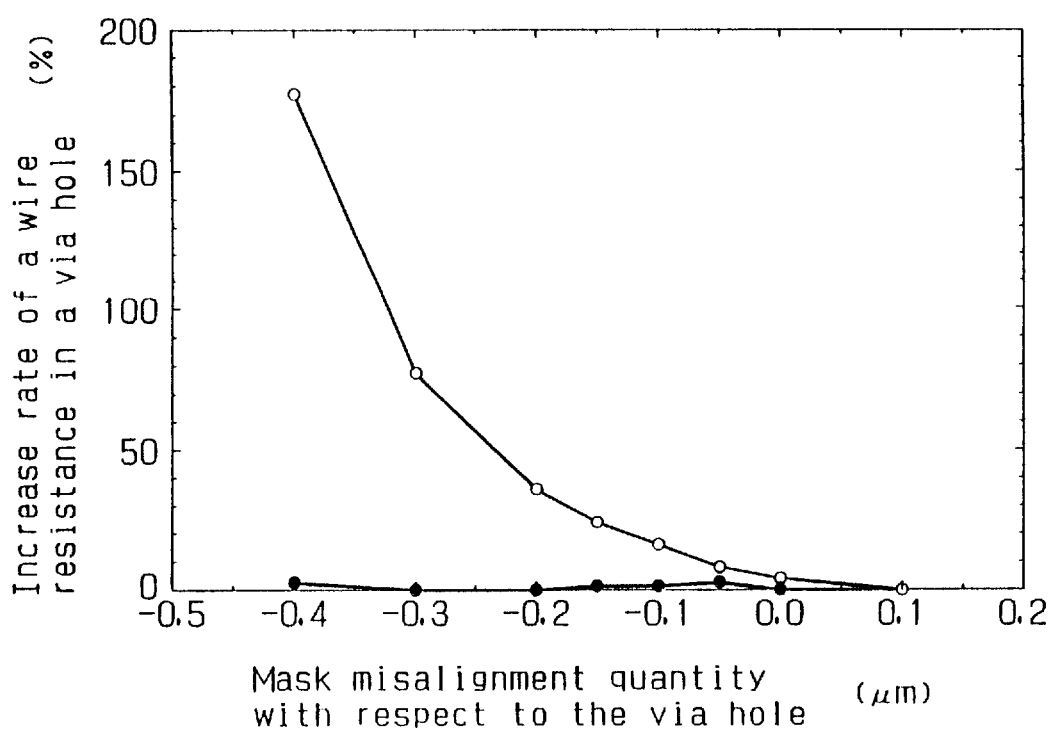
FIG. 5 is a view showing a relationship between an increase rate of a wire resistance in a via hole and a mask misalignment quantity with respect to the via hole in the second preferred embodiment.
Figure 6:
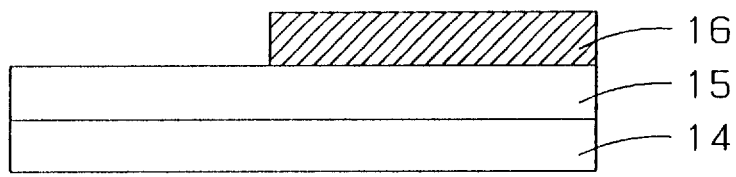
FIGS. 6(a)–6(d) are process sectional view showing a method of manufacturing a conventional semiconductor device.
Figure 6:
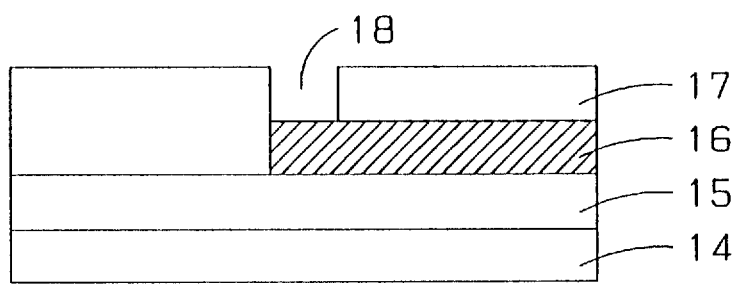
Figure 6:
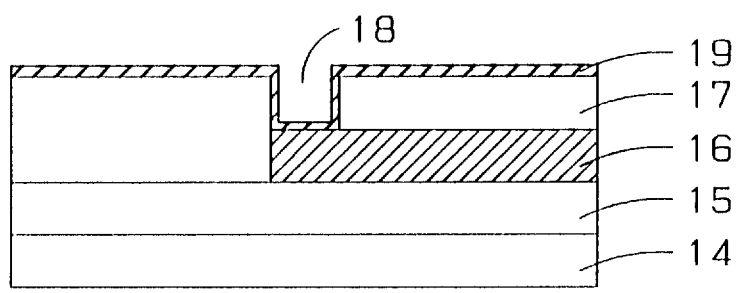
Figure 6:
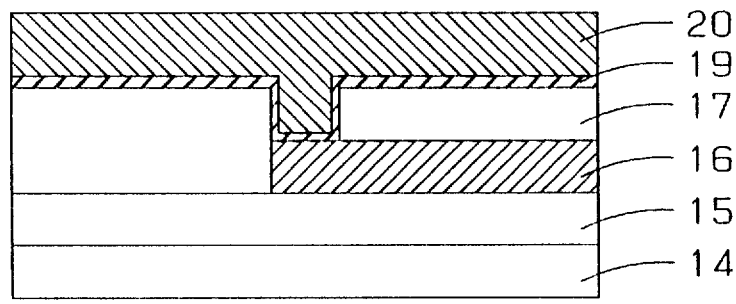
Figure 7:
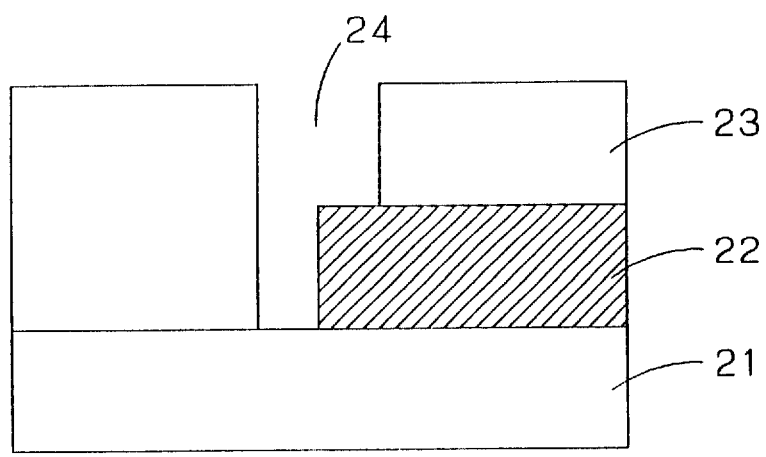
FIGS. 7(a)–7(c) are process sectional view showing a method of manufacturing a semiconductor device.
Figure 7:
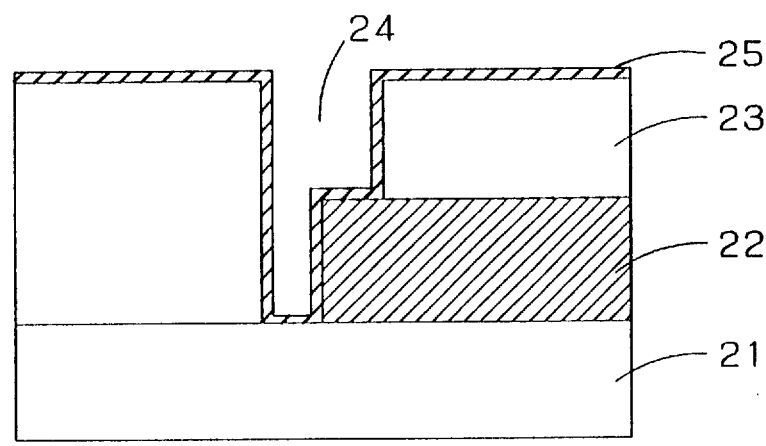
Figure 7:
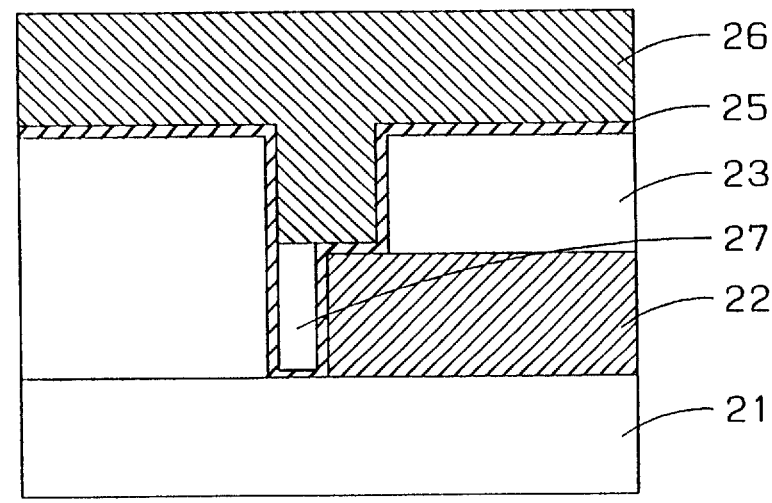

FIG. 5 shows a relationship between an increase rate of a wire resistance in a via hole (vertical axis) and a mask misalignment quantity with respect to the via hole (horizontal axis) in the second preferred embodiment. FIG. 5 also shows a relationship with the conventional technique for the purpose of comparison. White circles denote the conventional technique, while black circles denote the second preferred embodiment. The case using the conventional technique mentioned here is a case where Ar sputter etching is not performed which is done to make the edge and the side wall of the first Al-Si-Cu wire 8 slanted surfaces in FIG. 4. The conventional technique mentioned is otherwise similar to the second preferred embodiment. The increase rate of the wire resistance in the via hole denotes an increase rate to the wire resistance with the mask misalignment quantity with respect to the via hole of 0.1 µm. While the wire resistance increases as the mask misalignment quantity with respect to the via hole decreases in the conventional technique, in the second preferred embodiment, the wire resistance is not dependent upon the mask misalignment quantity. The wire resistance is approximately constant and does not increase. In the second preferred embodiment, the wire resistance is 166 Ω when the mask misalignment quantity with respect to the via hole is 0.1 µm, and the wire resistance is approximately constant against a change in the mask misalignment quantity. In the conventional technique, although the wire resistance is 130 Ω when the mask misalignment quantity is 0.1 µm, when the mask misalignment quantity becomes –0.2 µm or smaller, the wire resistance becomes larger than in the second preferred embodiment. In this case, the via hole is a round hole having a diameter of 0.6µm.

As described above, in the second preferred embodiment, even if the via hole 10 is formed deep and off the first Al-Si-Cu wire 8 as a result of alignment of a mask at a lithographic step, since the edge and the side wall of the first Al-Si-Cu wire 8 which are exposed within the via hole 10 are slanted surfaces as shown in FIG. 4, it is possible to completely bury the tungsten film 12 in the via hole 10. This prevents creation of a void within the via hole 10 and ensures electrical conduction all over the slanted surfaces of the first Al-Si-Cu wire 8. Hence, it is possible to reduce the wire resistance in the via hole 10.

Further, according to the second preferred embodiment, as the tungsten film 12 is buried in the via hole 10, a contact area of the tungsten film 12 and the first Al-Si-Cu wire 8 (through the tightly adhered layer 11) is large, and therefore, it is possible to decrease a current density within the wires. This improves an electromigration resistance better than in the first preferred embodiment.

The tungsten film 12 which is formed by a CVD method is used as a material to be buried in the via hole 10 in the second preferred embodiment. This is because the tungsten film 12 has an excellent step coverage as compared with the wire material which is obtained by a high-temperature sputtering Al method to form the wire 6 in the first preferred embodiment, and therefore, the tungsten film 12 is easier to bury in the via hole 10 and ensures a larger effect of reducing the wire resistance. As a material to be buried in the via hole 10, a conductive film material other than a tungsten film may be used. Further, when an aluminum film is used as a material to be buried in the via hole 10, since the aluminum film has a smaller specific resistance and easily flows at a low temperature, the aluminum film is more easily buried in the via hole 10, which in turn creates a greater effect of reducing the wire resistance than in a case where a tungsten film is used. Although the Al-Si-Cu films are used as a wire material in the first and the second preferred embodiments, Al alloy metal containing an element other than Si and Cu may be used. When conductive films of Ti, TiN, TiW, etc., but except for Al alloy metal are stacked on and under the Al-Si-Cu films as well, a similar effect is obtained.

Further, while a two-layered wire structure is described in relation to the first and the second preferred embodiments, a similar effect is obtained in a wire structure of three or more layers.

What is claimed is:

1. A semiconductor device, comprising:

a first wire which is formed on a semiconductor substrate, a side wall of said first wire having a slanted surface which is at an obtuse angle with respect to a top surface of said semiconductor substrate;

an interlayer insulation film which is formed on the first wire;

a via hole which is opened in said interlayer insulation film in such a manner that said slanted surface of said first wire is exposed and a top end portion of said via hole is defined by a slanted surface of said interlayer insulation film, said slanted surface of said interlayer insulation film being at an obtuse angle with respect to said top surface of said interlayer insulation film; and a second wire which is formed in the via hole and on said interlayer insulation film.

2. A semiconductor device, comprising:

a first wire which is formed on a semiconductor substrate, a side wall of said first wire having a slanted surface which is at an obtuse angle with respect to a top surface of said semiconductor substrate;

an interlayer insulation film which is formed on the first wire;

a via hole which is opened in said interlayer insulation film in such a manner that said slanted surface of said first wire is exposed and a top end portion of said via hole is defined by a slanted surface of said interlayer insulation film, said slanted surface of said interlayer insulation film being at an obtuse angle with respect to said top surface of said interlayer insulation film;

a conductive film which is buried in the via hole; and a second wire which is formed on the conductive film and said interlayer insulation film.

3. The semiconductor device of claim 2, wherein the conductive film which is buried in the via hole is formed by an aluminum film.

4. The semiconductor device of claim 2, wherein the conductive film which is buried in the via hole is formed by a tungsten film.

5. The semiconductor device of claim 2, wherein the conductive film is formed by aluminum.

* * * * *